United States Patent [19]

Matthews

[11] Patent Number: 4,532,628
[45] Date of Patent: Jul. 30, 1985

[54] SYSTEM FOR PERIODICALLY READING ALL MEMORY LOCATIONS TO DETECT ERRORS

[75] Inventor: David J. Matthews, Arlington, Mass.

[73] Assignee: The Perkin-Elmer Corporation, Norwalk, Conn.

[21] Appl. No.: 470,901

[22] Filed: Feb. 28, 1983

[51] Int. Cl.³ .............................................. G06F 11/10
[52] U.S. Cl. ...................................... 371/13; 371/21; 371/38
[58] Field of Search ............................. 371/13, 21, 38; 365/200, 201; 364/200 MS File, 900 MS File

[56] References Cited

U.S. PATENT DOCUMENTS 3,735,105  5/1973  Maley ..................................... 371/38
3,751,649  8/1973  Hart, Jr. ............................... 371/21 X
4,051,460  9/1977  Yamada et al. ....................... 364/900
4,300,234 11/1981  Maruyama et al. ............. 364/900 X
4,319,356  3/1982  Kocol et al. ........................... 371/38
4,380,812  4/1983  Ziegler, II et al. .................... 371/38

Primary Examiner—Jerry Smith
Assistant Examiner—Mark Ungerman
Attorney, Agent, or Firm—E. T. Grimes; J. D. Crane

[57] ABSTRACT

A memory checking circuit for periodically reading the data from all locations therein. The circuit includes logic to correct and restore data from locations where an error has occurred. The circuit quickly identifies all memory locations present during search mode at a fast rate and reads all present locations at a slower rate during normal mode.

3 Claims, 13 Drawing Figures

| FIG. 3A | FIG. 3B |

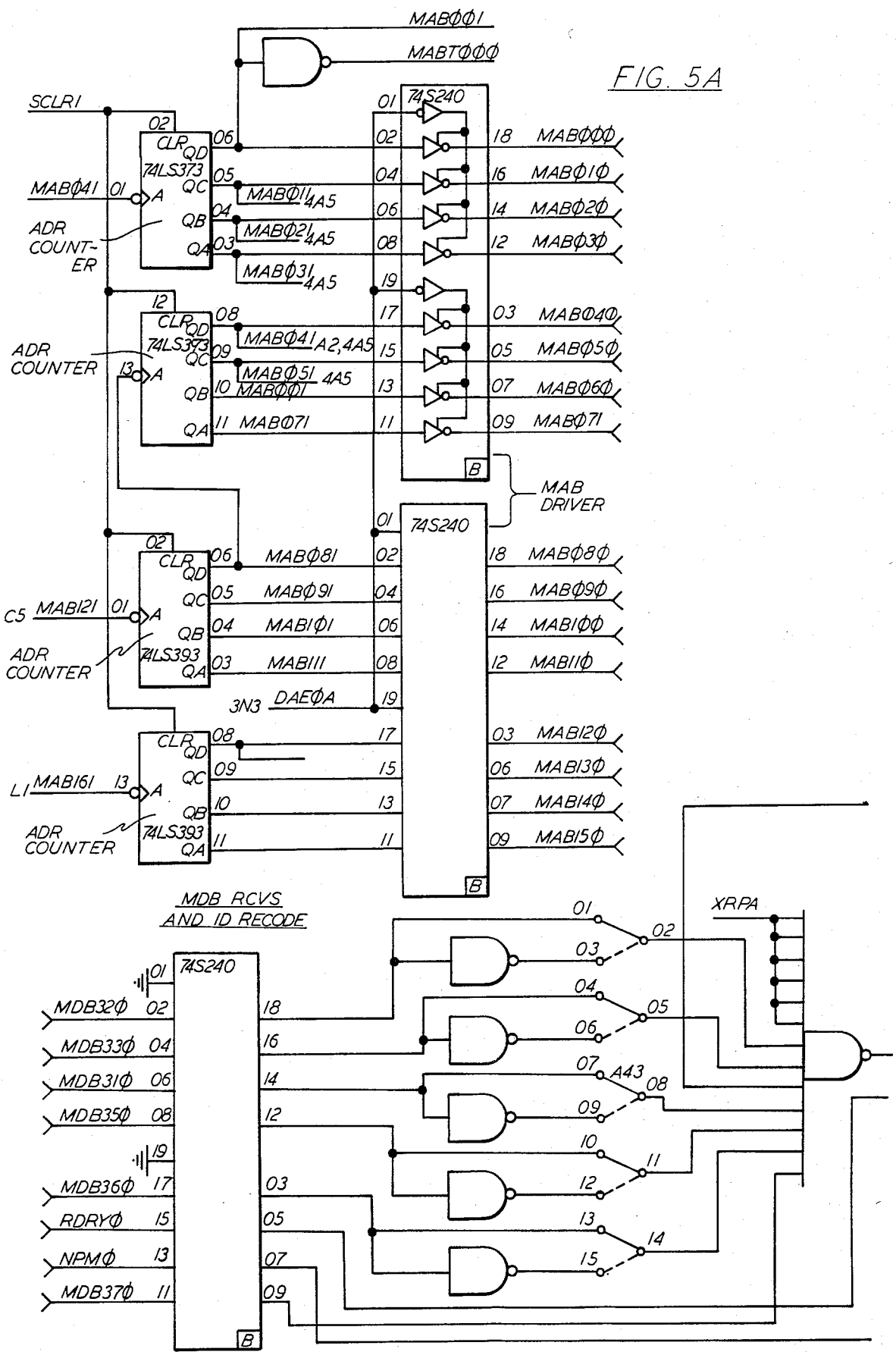

SYSTEM FOR PERIODICALLY READING ALL MEMORY LOCATIONS TO DETECT ERRORS

BACKGROUND OF THE INVENTION

This invention relates broadly to the field of dynamic semiconductor memories and particularly to a circuit for improving the mean time between failures for large size dynamic semiconductor memories.

The reliability of a dynamic semiconductor memory is known to be a function of the failure rate of individual random access memory cells, the density of the memory cells on a chip and the quality of the chip. Failures which occur on such chips are classified as "hard" and "soft" failures where "hard" failures comprise a permanent malfunction while "soft" failures are intermittent failures. "Hard" failures in dynamic semiconductor chips frequently take the form of failures of a single cell, a bit line, a word line or other physical portion of the chip. "Soft" failures, however, are most frequently caused by radiation such as alpha particle radiation due to the radioactive decay of trace amounts of uranium or thorium in the packaging materials used for the chips. Such "soft" failures are usually of the type where only a single bit is affected.

In order to enhance the reliability of dynamic semiconductor memories, numerous approaches are utilized. To deal with "hard" failures, periodic maintenance is performed to check and replace chips which show high error rates or complete failure. Regular maintenance schedules are maintained to accomplish this.

However, statistical analysis has shown that single cell "soft" errors occur far more frequently than any other type of error. In order to reduce single cell "soft" failures, manufacturers have introduced coatings to isolate the semiconductor from the radioactive traces in the package surrounding them. This has helped a great deal although it has not eliminated the problem.

Still another approach to the "soft" error problem is to utilize an error checking and correcting scheme. This approach involves use of a code, along with the data. When an error on readout from memory is detected, the code and the data are run through an error correcting circuit to correct the error. The corrected data is then written back into memory and transmitted elsewhere in the system coupled to the memory. However, this approach is not effective when some multiple/double bit errors have occurred because while double and some multiple errors are detected by the error detecting and correcting scheme, they are generally not correctable.

The above-mentioned technique for correcting single bit "soft" errors is operative to detect and correct such errors on readout of data from the location where an error has occurred. This approach, however, is not capable of discovering when such an error occurs and cannot assure that a second "soft" error does not occur at the same location in the memory before it is read. This is especially true for memory locations which are infrequently read.

It is therefore a primary object of the present invention to provide a means to check all locations in a dynamic semiconductor memory and correct single "soft" failures before they become undetectable double errors.

It is a further object of the present invention to provide a circuit to check all locations of a dynamic semiconductor memory and correct any "soft" errors detected, the circuit being operative without modification regardless of the size of the memory it is designed to check.

It is a further object of the invention to provide a circuit for correcting "soft" failures before they become "hard" or double failures which may not be detectable while only minimally interfering with normal system operation.

BRIEF DESCRIPTION OF THE INVENTION

The foregoing objects, advantages and features of the present invention are achieved through the use of the circuit, according to the present invention, which becomes operational during the power on sequence to rapidly identify the existing locations of the dynamic semiconductor memory attached thereto. An indication is stored in a local memory to identify the locations present in the memory system. Thereafter, the circuit sequentially accesses all the memory locations at a relatively slow rate to minimize interference with the system coupled to the memory. As each memory location is read, the data is checked and, if a single-bit error is detected, the error is corrected and the data restored to the memory. The error is also noted for later evaluation by a service engineer to determine if it was a random error or whether hardware should be replaced.

DESCRIPTION OF THE DRAWINGS

The present invention is described below in greater detail in connection with the drawings which form a part of the disclosure wherein:

FIG. 5 illustrates the manner in which FIGS. 5A and 5B interfit with each other; and FIGS. 5A and 5B show a further portion of the circuitry of the preferred embodiment of the invention.

DETAILED DESCRIPTION OF THE INVENTION

It should be noted that throughout the following detailed description, signal names are given such as EOS0 or TARY1. The number at the end of the signal name is used to designate the logic level of the signal when it is active. For example, the end of search signal EOS0 is active when the level of the signal is low while TARY1 is active when the level of the signal is high. This scheme of using the number at the end of the signal name to designate its active state is used throughout the following discussion.

Figure 1:
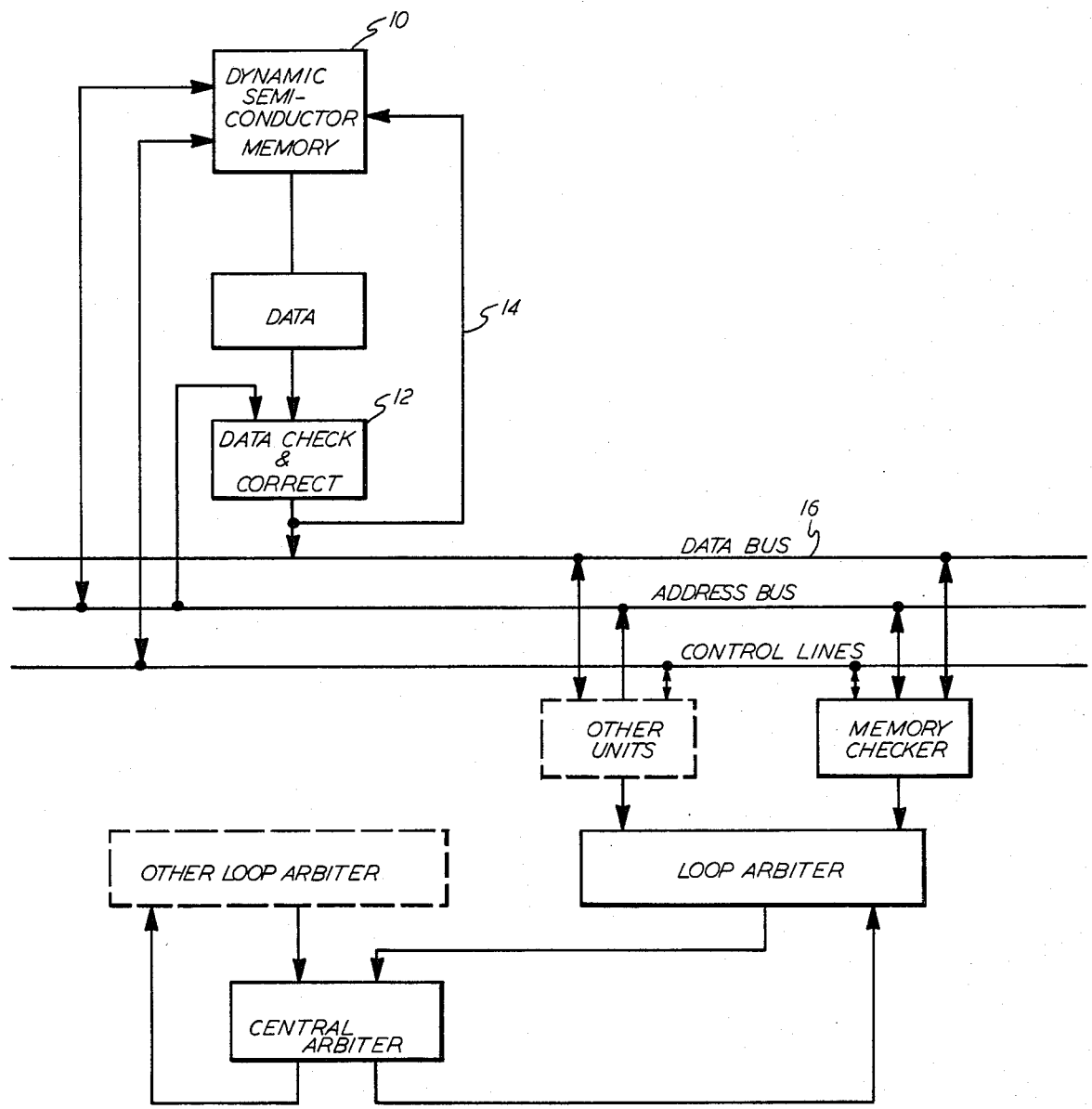
FIG. 1 illustrates a system in which the circuit of the present invention has application.

Referring first to FIG. 1, which is a block diagram of a system including the present invention, a system of the type illustrated in FIG. 1 is described in greater detail in U.S. Pat. No. 4,314,335 which is incorporated herein by reference.

The system in FIG. 1 has a dynamic semiconductor memory 10 which consists of, in the preferred embodiment, a plurality of 64 Kbyte dynamic RAMs wired in a conventional manner such as in a Perkin-Elmer Model 3250 computer. The memory of that computer typically may have a capacity of between 1 and 16 million bytes where each byte is 8 data bits long plus parity bits. The memory is configured so that a full word consisting of 4 bytes is read each time a location is read or written.

Data read from the memory 10 passes through a conventional data checker and correction unit 12. In the event that the unit 12 detects that the data read from the memory 10 is in error, the unit 12 corrects the data and restores the corrected data over the line 14 to the location read from memory 10. The correct data, when no error is detected, or the corrected data, when an error is detected and corrected, is placed onto the data bus 16 which couples to all the other elements of the computer system coupled thereto. The unit making the request, however, is the only unit which will capture the data on the bus 16.

The exact technique used by the data check and correct circuit 12 for detecting and correcting errors in the data from the memory 10 is not critical to the present invention. Indeed, the prior art includes numerous methods and apparatus for detecting and correcting errors detected in digital computer systems and the like. The system according to the present invention, however, utilizes an error checker and corrector 12 which, during every memory read operation, detects and corrects all correctable errors detected thereby and restores the corrected data to the memory 10. The corrected data is also placed on the data bus 16. In addition, the system causes an error indication to be stored in an error log in a conventional manner to identify the location at which the error was detected. The error indication in the error log can thereafter be reviewed and corrective maintenance performed, if deemed necessary. The circuitry and method for the error logging is not a part of the present invention and may be performed by numerous circuits such as those used in the Perkin-Elmer Model 3250 computer.

The system according to the present invention includes circuitry to first determine the locations present in the attached dynamic semiconductor memory and then to periodically access, at a slow rate, each present memory location. As each memory location is read, the memory data checker and corrector 12 then checks and corrects any accessed location where a correctable error is detected. The failing location is listed in the error log. By periodically accessing each location in memory, soft errors can be detected and corrected before they become double or uncorrectable.

Figures 2, 2A:
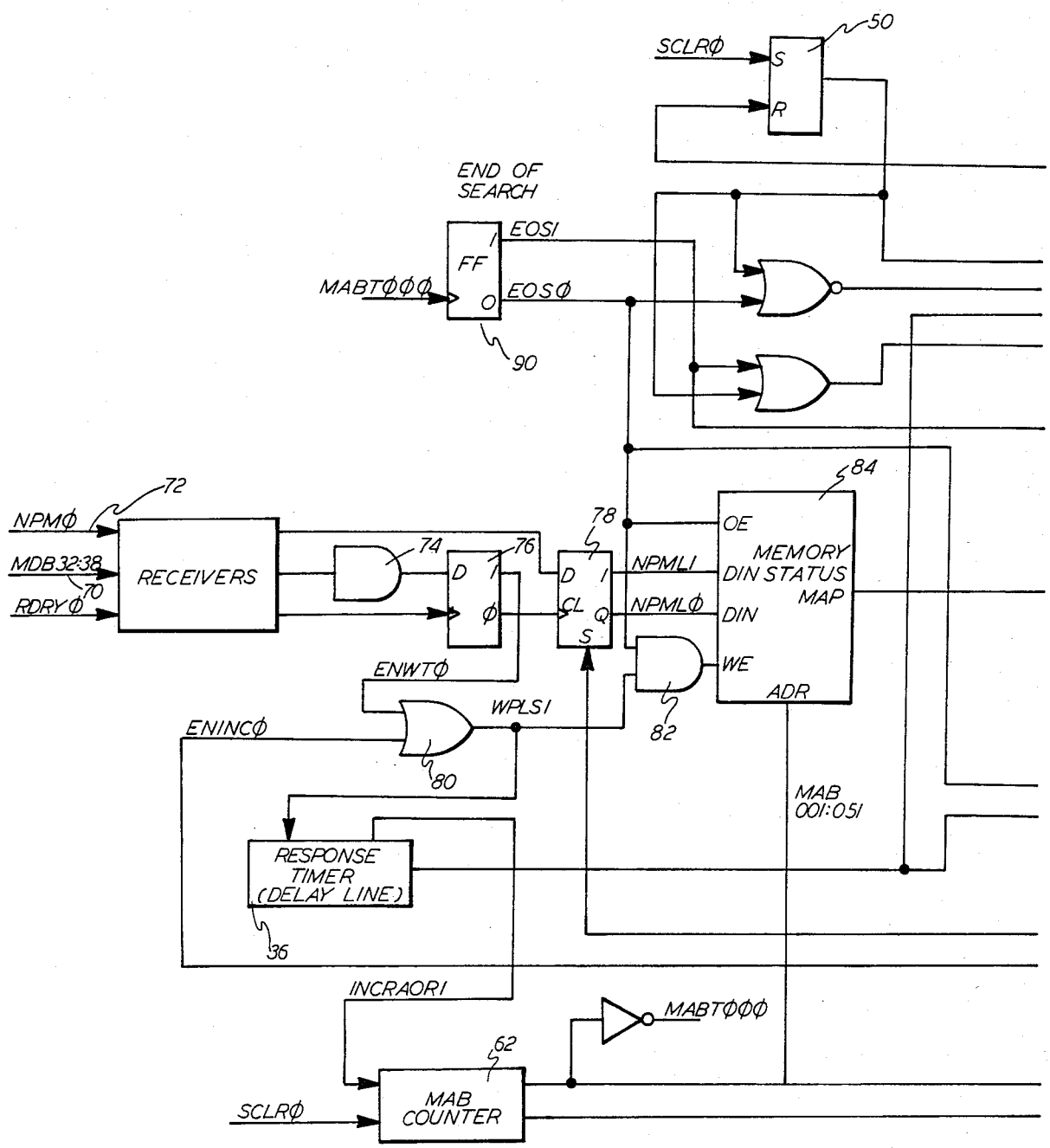
FIG. 2 illustrates the manner in which FIG. 2A and 2B interfit with each other.
FIG. 2A and 2B show a block diagram of the circuitry of the present invention.
Figure 2B:
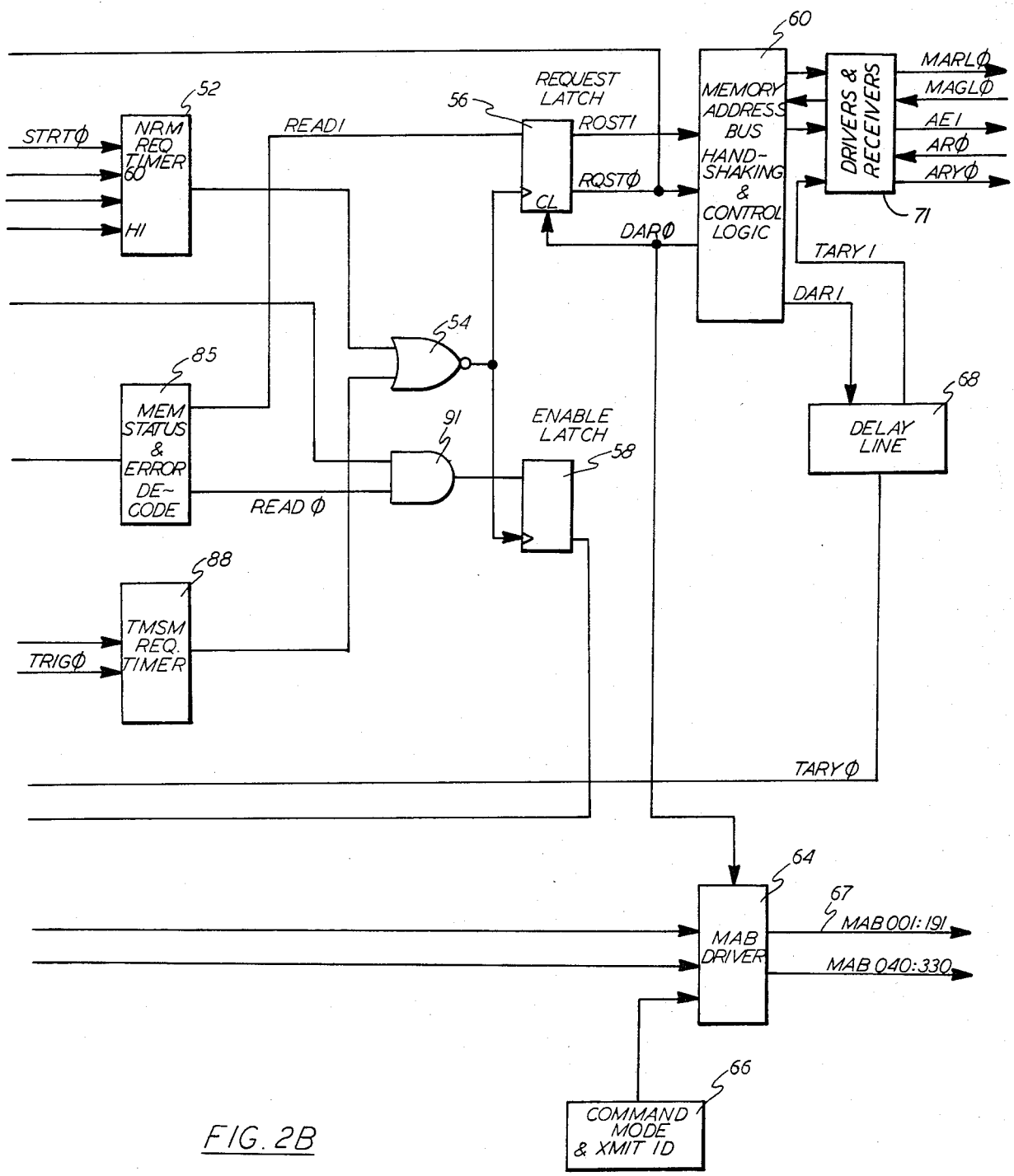
Figures 3, 3A:
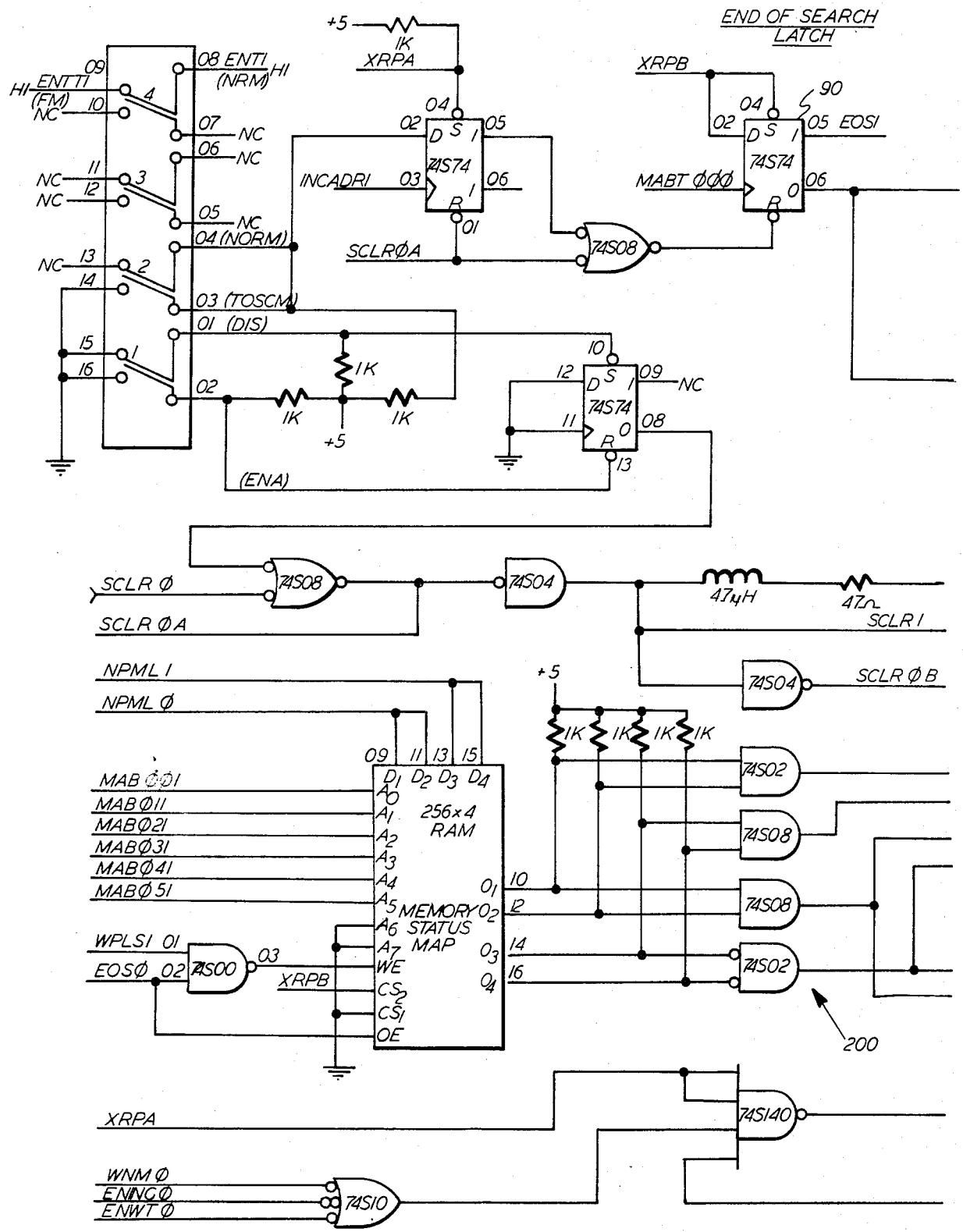
FIG. 3 illustrates the manner in which FIGS. 3A and 3B interfit with each other.
FIGS. 3A and 3B show a portion of the circuitry of the preferred embodiment of the invention.
Figure 3B:
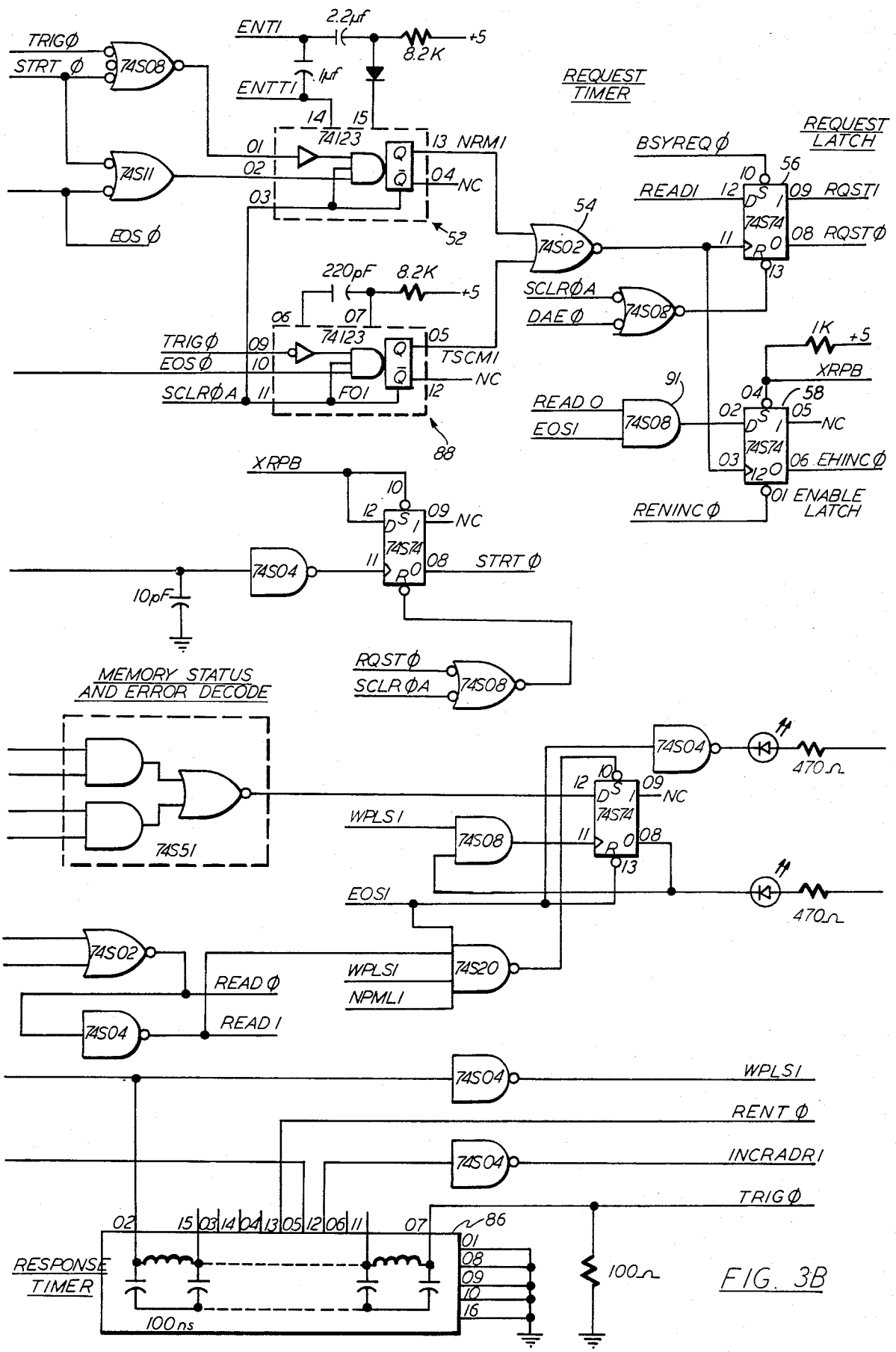
Figures 4, 4B:
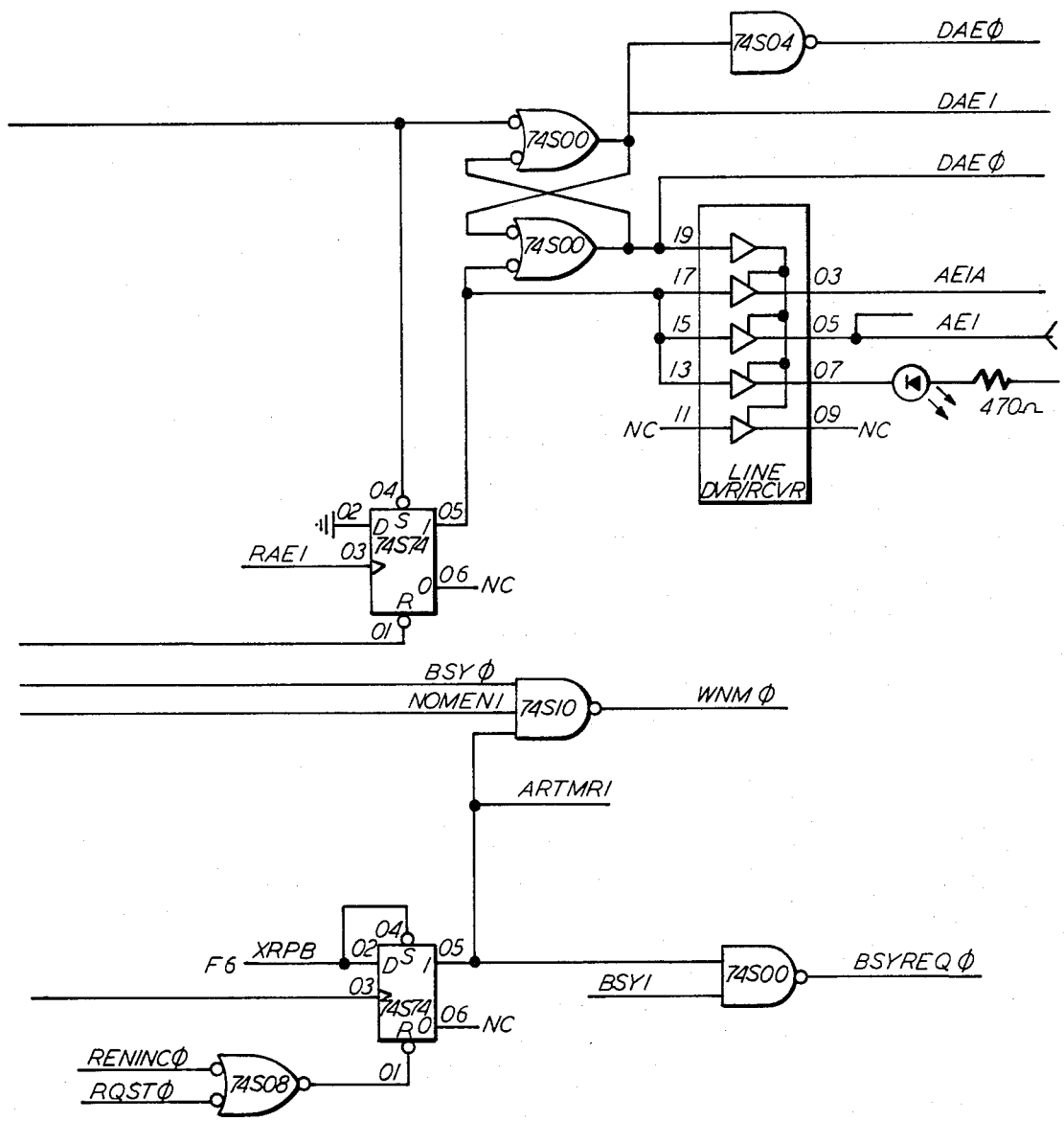
FIG. 4 illustrates the manner in which FIGS. 4A and 4B interfit with each other.
FIGS. 4A and 4B show a further portion of the circuitry of the preferred embodiment of the invention.
Figure 4A:
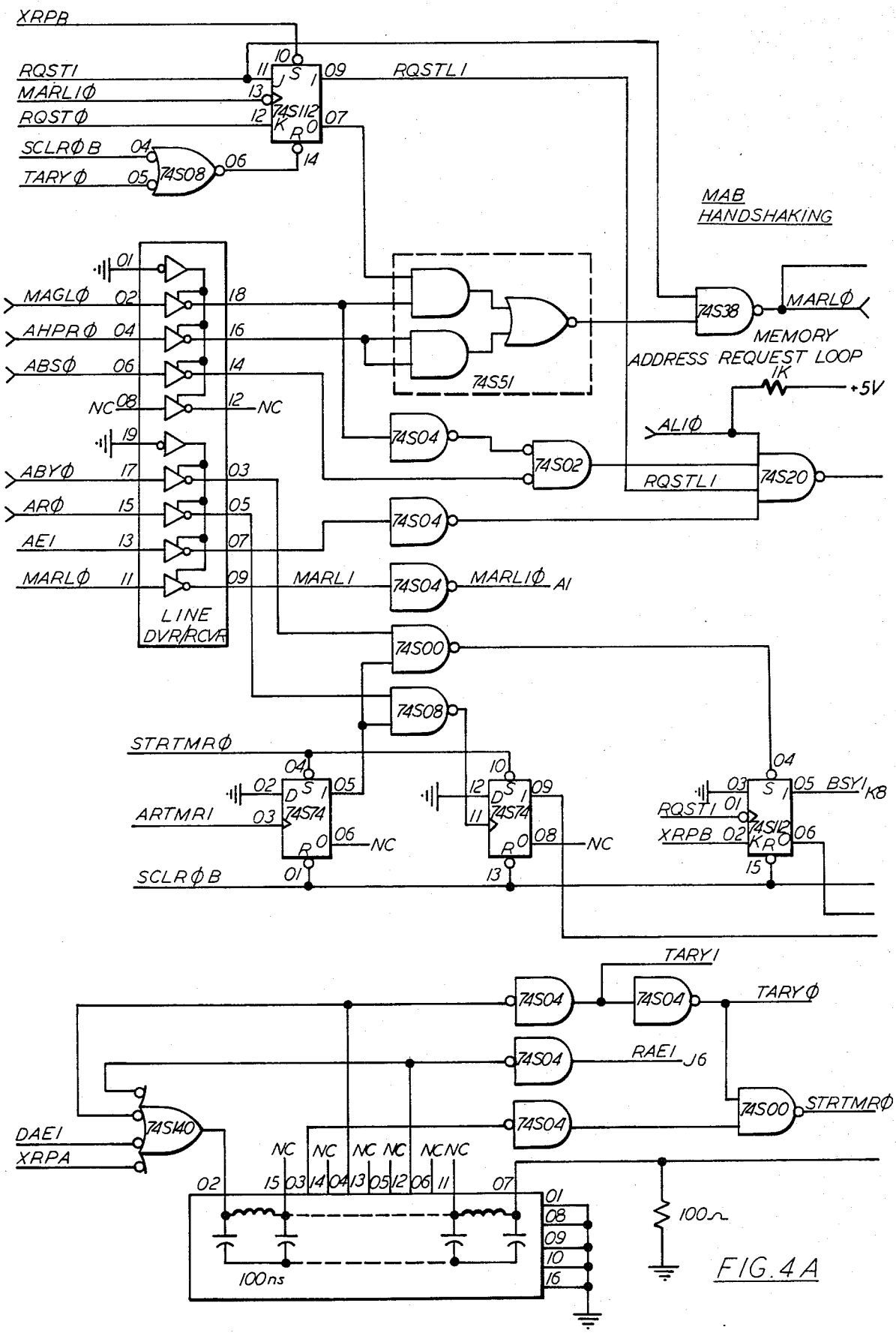
Figures 5, 5B:
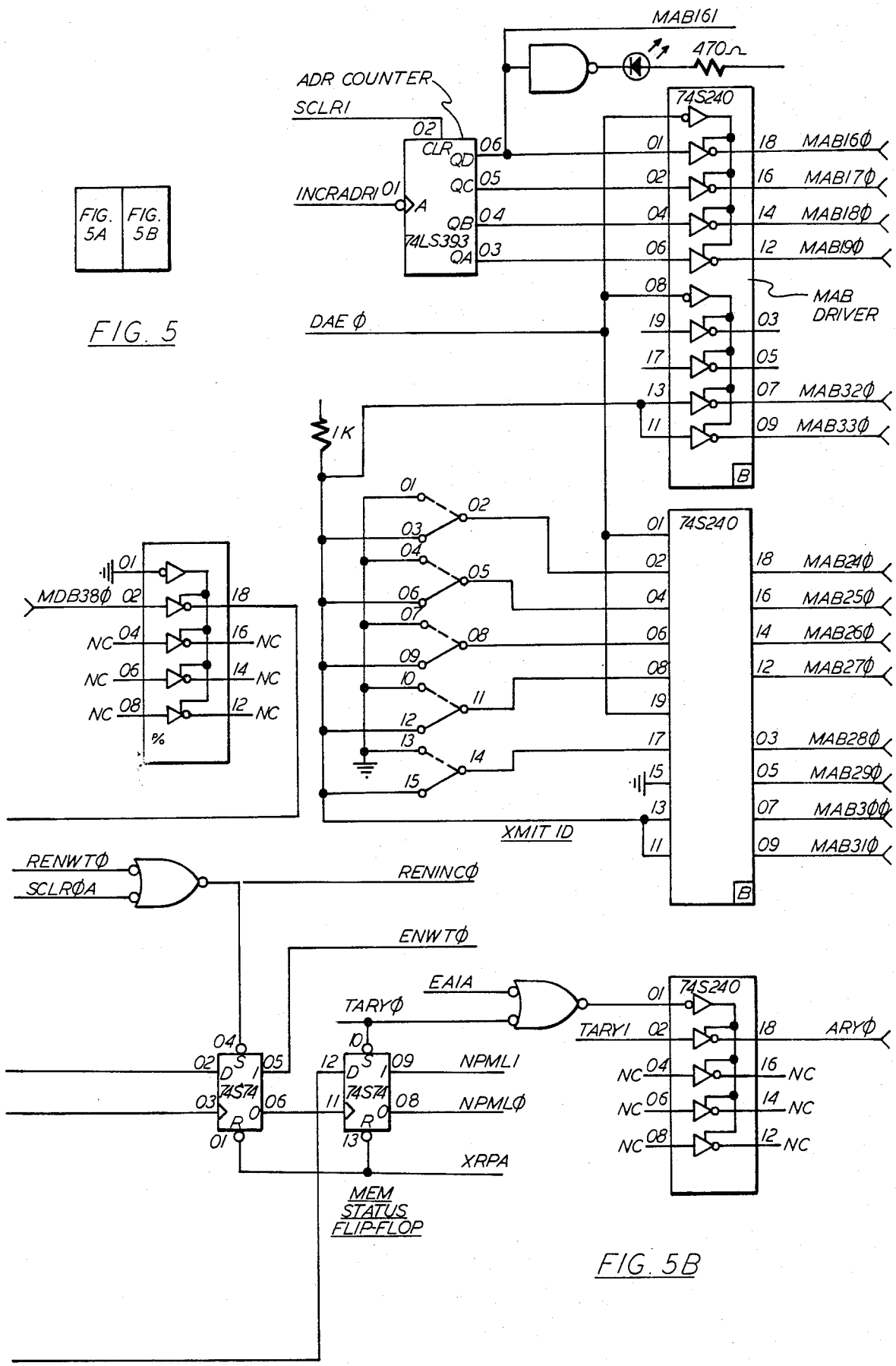

The circuitry for determining the memory locations present in the system and thereafter periodically reading data from all present system memory locations is illustrated in the block diagram of FIG. 2. During the power up sequence, the power supply produces a system clear signal designated SCLR∅. This signal is produced after the power supply has reached its nominal level and the system is operational. The rising edge or trailing edge of the signal SCLR∅ is received at the set input to flip flop 50 which latches the system clear (SCLR∅) signal and produces a start signal at its output designated STRT∅. The STRT∅ signal is utilized to start the circuit of FIG. 2 in its search to identify all present addresses for the memory system coupled thereto.

The start signal (STRT∅) couples to and triggers the normal request mode timer 52 which comprises a single shot or similar circuit for producing a request pulse at its output. The request pulse produced thereby is coupled to an OR gate 54, the output of which couples to the clock input of both the request latch 56 and the enable increment latch 58. At this time, the data input to latch 56 is high so it is set thereby driving RQST1 high and RQST∅ low. Meanwhile, the data input to latch 58 is low so its state remains unchanged. The output of the latch 56 labelled RQST∅ couples to the reset input of the flip flop 50. Accordingly, the request signal on line RQST∅ operates to reset flip flop 50. The RQST1 and RQST∅ signals couple to the memory address bus handshaking and control logic 60 and are responsible for that circuit initiating a request for service on the memory bus on line MARL∅. The arbiter as described in U.S. Pat. No. 4,314,335 eventually responds thereto with a memory access granted signal on line MAGL∅ causing the memory checker to drive line AE1 low.

At the same time that SCLR∅ is setting the flip flop 50, it is also input to the memory address bus counter 62 which is reset thereby to zero. The output of the counter 62 couples to the memory address bus drivers 64 which couple to the address bus 67. The all zero address from the counter 62 is gated onto the bus 67 when the deactivate address enable (DAE∅) signal becomes active.

A command code and transmit identifier is generated by the generator 66. The command code set up by the generator 66 is for a quad (4) word read and the identifier which identifies the requesting unit. This information is placed onto the input of drivers 64 to the memory address bus lines 67.

The deactivate address enable signal (DAE1) goes high on receipt of the memory access granted signal (MAGL∅) and couples to a delay line 68. The DAE1 signal is delayed by the delay line 68 and becomes TARY1 which is inverted by a driver 71 to become ARY∅. ARY∅ is a strobe signal to the memory to indicate the address on the address bus 66 is valid. At the same time, DAE1 goes active, the inverse thereof DAE∅ also goes active and gates the MAB drivers 64 to place the command code, the transmit identifier and the address onto the memory address bus 67.

On receiving ARY∅ and the address on the memory address bus 67, the memory produces a signal AR∅ which acknowledges that the address has been received by the memory. Thereafter, the data on the memory data bus 70, positions 32 to 38, and the data on the nonpresent memory line 72 are strobed by the read data ready line (RDRY∅) when it is received from the memory. The data on lines 32 to 38 are decoded by a decoder 74 to set flip-flop 76 when the decoded combination of data on the lines 32 to 38 indicates that the read data and the non-present memory line data is for use by the circuitry of FIG. 2.

TARY∅ presets non present memory latch 78 active (NPML1=1) for the case where no memory responds. The setting of flip-flop 76 (ENWT∅) then causes the state of NPM1 to be latched. Flip-flop 78 will be set (NPML1=1, NPML∅=0) for the case where no memory exists.

The setting of the flip flop 76 also produces an enable write signal ENWT∅ which is applied to the OR gate 80 to produce a write enable signal WPLS1 to the AND gate 82. The write signal WPLS1 plus the end of search signal EOS∅ not being enabled cause the AND gate 82 to produce a signal at its output which is coupled to the write enable WE input of the memory status map memory 84. The write enable signal causes the memory 84 to store the data on the Din lines at an address defined by the 6 highest order address bit positions from the memory address bus counter 62. As such, the data stored in the memory status map 84 indicates whether or not each block of 256 Kbytes is present or not. The size of 256 Kbytes is chosen by the fact that the present system memory is made up of 256 Kbyte pluggable modules. If a smaller (larger sizes would still work) sized pluggable module were used, the number of address bits to the memory status map 84 must be adjusted accordingly so that a present or missing indication can be stored for each pluggable memory module that can be installed on the system.

The write enable signal WPLS1 couples to a response timer 86 which comprises a delay line having a plurality of output taps therefrom whose signal is the same as the write enable signal WPLS1 only delayed in time. The longest delayed output of the response timer 86 is designated TRIG∅ which is used to trigger the top of memory search mode request timer 88. The request timer 88 comprises a single-shot for producing a pulse at its output which is coupled via the OR gate 54 to the clock input of the request latch 56 and the enable latch 58. This request latch 56 is set and the enable latch 58 is not set each time the search mode request timer 88 is activated by the signal TRIG∅. Accordingly, a further request is generated to the memory address bus handshaking and control logic 60 thereby causing another memory address location to be fetched from an address specified by the memory address bus counter 62. Since the response timer 86 produced an increment address signal INCRADR1 prior to the time it produced the trigger signal TRIG∅, the increment address signal INCRADR1 was applied to the memory address counter 62 causing it to be incremented by 1. Accordingly, the output of the counter 62 is one quad word greater than it was the previous time that the request latch 56 was set.

The top of memory search continues with the status of the nonpresent memory line (NPM∅) being stored in the memory status map 84 a plurality of times for each block of 262, 144 memory locations (referred to as 256K). When the high order memory address byte changes from a one to a zero, the state of the line MABT∅∅∅ changes from a zero to a one causing the end of search latch 90 to be set. This causes the end of search signal EOS∅ to go low, thereby blocking AND gate 82 and disabling the top of memory search mode request timer 88. Accordingly, the memory status map 84 can no longer be written because the write enable line WE is no longer enabled and the top of memory search mode is terminated because the top of memory search request timer 88 is disabled. It also conditions AND gate 91 so that the enable latch 58 is set according to the level of line READ∅. During normal run mode, latch 90 is set and the line EOS1 is high.

The ending of the search for present memory locations sets the end of search latch 90 thereby initiating the normal run mode where each present location of memory is fetched periodically. The EOS1 line from the end of search latch 90 couples to the timer 52 to enable it. The timer 52 has timing capacitors 53 coupled thereto where value is selected so it will gate the request latch 56 and the enable latch 58 at a rate which will not adversely affect the ability of other system elements to read or write to memory but at a sufficiently high rate so that it is unlikely that double bit errors in infrequently used memory locations will occur. In the preferred embodiment illustrated in FIGS. 3, 3A, 4, 4A, 5 and 5A, the request timer 52 is set so that it will access memory at a rate so that each of the 16 million possible locations can be fetched once every 1½ hours. The interference caused by the circuitry of FIGS. 3–5A to memory operation is very small and in the order of about 0.003% of the memory address bus bandwidth and about 0.009% of the memory data bus bandwidth. This allows the effect of the periodically fetching and correcting, if necessary, the data stored at all memory locations to be unnoticed by the remaining elements of the system.

Once the largest possible address in memory has been addressed during search mode, the signal INCRADR1 increments the address counter 62 coupled to the memory address bus (MAB) 67 causing the high order bit position (MAB∅∅∅) to change state. When this occurs, the line MABT∅∅∅ goes from a low to a high level thereby setting the end of search latch 90. This causes the normal run mode timer 52 to be enabled and the top of memory search mode timer 88 to be disabled.

The end of search latch 90 being set also causes the memory status map 84 to be gated so that the location addressed by the ADR lines is read. The memory status and error decode circuit 85 decodes the memory output to determine if the addressed location in main memory is present in the system. It will be recalled that each location of the map 82 is filled with data during the top of memory search mode indicating whether the addressed location is present in the system. When the addressed location is present, the level of READ1 is high and READ∅ is low. However, when the location is not present READ1 is low and READ∅ is high.

Sometime after the status map 84 is addressed, the delay line 86 puts out a trigger pulse TRIG∅ which goes low. This causes the normal run mode timer 52 output to produce a positive pulse on line NRM1 which is inverted by the NOR gate 54. The trailing edge of this pulse at the NOR gate 54 output (the rising portion) clocks the request latch 56 and the enable latch 58. This initiates a request to fetch the data at the location specified by the MAB counter 62 if it is present as indicated by the line READ1. A memory access request is issued in the manner described earlier. If the location is not present, the READ1 line is low and the request latch 56 is not set.

However, since the READ∅ signal is high when a location is not present and the EOS1 line is high, the AND gate 90 output, which couples to the D input of latch 58, causes the latch 58 to be set. READ1 being low prevents latch 56 from being set. The setting of latch 58 causes the enable increment signal ENINC∅ to go low. The enable increment signal ENINC∅ is coupled by the OR gate 80 to the response timer delay line 86. The outputs of the delay line 86 causes the memory address counter 62 to be incremented to the next address, as well as later causing the trigger signal TRIG∅ to be issued again thereby initiating a request to read the next memory location.

The circuit continues to periodically attempt to read all possible memory locations and to actually initiate a read to each location indicated by the data in the memory status map 84 to be present. As each location is read, the error checker and corrector checks the read data and, if an error is detected, it is thereafter corrected and the corrected data restored to memory.

While the above description has been made with reference to the preferred embodiment as illustrated in the drawings, those of skill in the art will realize that the illustrated embodiment is merely illustrative of one approach for implementing the present invention. Those of skill in the art will readily recognize that the illustrated circuits may be replaced by other similar circuits so as to implement the described functions.

These and other changes can be made without departing from the spirit and scope of the invention.

What is claimed is:

1. In a computer system including a solid state memory with a plurality of addressable locations and an error detector/corrector circuit for checking data as it is read from the memory and correcting the data if a detectable error has occurred, the corrected data being stored in the addressed memory location to assure that the correct data is in memory, a circuit to identify all directly addressable memory locations present and to periodically read each present location comprising, in combination:
   address generator means operative during a search mode for producing each directly addressable memory location;
   read request means to request, during said search mode, that each address produced by said address generator be read by the memory;
   storage means responsive to each read request to store an indication from the memory whether the addressed location is present or not present;
   said address generator operative during a normal run mode to generate periodically all possible directly addressable locations at a rate slower than addresses are generated thereby during said search mode;
   means operative during normal run mode, and responsive to said storage means and said address generator to initiate a memory read whenever the address produced by said address generator is indicated to be present by the data in said storage means.

2. In a digital computer system including a memory with a plurality of individually addressable locations, each location for storing data for later retrieval, and a data error detect and a correct circuit for checking the data as it is read from a memory location and correcting the data if a correctable error has occurred, a circuit to identify all present memory locations during a search mode and to periodically read all present memory locations during normal run mode and to correct the data at each present location where a data error is detected on reading the data from the addressable location comprising, in combination:
   mode defining means alternatively defining a search mode or a normal mode;
   address generator means responsive to said mode defining means being in said search mode to generate in succession each possible memory address and to apply the produced address to the memory, the memory producing an indication whether the addressed location is present or not present;
   storage means responsive to said mode defining means being in said search mode to store for each possible memory address, said indication from the memory indicating whether the addressed location is present or not;
   said mode defining means being responsive to said address generator means having once produced each possible memory address for which said storage means has stored an indication whether the location is present or not to change the mode to said normal mode;
   said address generator being responsive to said mode defining means being in said normal mode to periodically generate all possible memory addresses at a rate slower than the rate of address generation during said search mode, said address generator being operative to apply said memory address to said memory if said indication in said storage means for said generated address indicates the corresponding memory location is present.

3. A method for refreshing a solid state memory with a plurality of addressable locations, the method comprising the steps of:
   attempting to address during a search mode all possible memory address locations;
   storing during said search mode an indication whether each address location is present in the system;
   periodically generating during a normal mode all possible memory addresses at a rate slower than the addresses were produced during said search mode; and
   reading and restoring each periodically generated memory address location during said normal mode when the address thereof is generated and when the indication for that address location is that it is present in the system, the restored data being corrected as needed in accordance with an error correction code stored with each addressed location.

* * * * *